(12) United States Patent
Bishay et al.

(10) Patent No.: US 6,486,522 B1
(45) Date of Patent: Nov. 26, 2002

(54) LIGHT SENSING SYSTEM WITH HIGH PIXEL FILL FACTOR

(75) Inventors: Magued Bishay, Costa Mesa, CA (US); Randall M. Chung, Laguna Niguel, CA (US); James K. Dawson, Huntington Beach, CA (US); David Escobar, San Juan Capistrano, CA (US); Mike Fukatsu, La Mirada, CA (US); Edward Andrew Jakl, Tustin, CA (US); Richard Arthur Mann, Torrance, CA (US); Sarit Neter, Irvine, CA (US); Ian Olsen, Irvine, CA (US); Gregory A. Urban, Las Flores, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/407,741

(22) Filed: Sep. 28, 1999

(51) Int. Cl.[7] .............................................. H01L 31/00
(52) U.S. Cl. ....................... 257/444; 257/431
(58) Field of Search ................. 257/431, 443, 257/444

(56) References Cited

U.S. PATENT DOCUMENTS

| | | | | |
|---|---|---|---|---|
| 4,894,699 A | * | 1/1990 | Hayashi et al. | 257/435 |
| 5,498,880 A | * | 3/1996 | Lee et al. | 250/580 |
| 5,619,033 A | * | 4/1997 | Weisfield | 250/208 |
| 5,698,874 A | * | 12/1997 | Hayashi | 257/233 |

FOREIGN PATENT DOCUMENTS

EP      0 764 987 A2 *   3/1997

* cited by examiner

Primary Examiner—Allan R. Wilson
(74) Attorney, Agent, or Firm—Akin, Gump, Strauss, Hauer & Feld, LLP

(57) ABSTRACT

The invention is an imaging device having a high fill factor. The high fill factor is achieved by constructing the light sensors in a vertical fashion in the imaging device. The control circuitry of the light sensor is then contained inside the integrated circuit chip, rather than taking up area that could otherwise be used for light collection. The majority of the area on the surface of the IC chip is made up of light sensing elements, since the control circuitry is embedded in the IC chip. The control circuitry is connected to the light sensing devices through vias in the IC chip. The control circuitry of the chip is mainly contained within the die, rather than on it.

21 Claims, 6 Drawing Sheets

LIGHT SENSING SYSTEM WITH HIGH PIXEL FILL FACTOR

PATENT APPLICATION

1. Technical Field

The present invention is directed to imaging sensors and the associated imaging devices. In particular, the invention is directed towards a more compact imaging sensor providing for more efficient operation of an imaging device and providing for denser pixel structure on the imaging device.

2. Related Art

Conventional image technology usually places most acquisition and control elements near the surface of a wafer. A pixel structure occupies an area on the wafer or integrated circuit (IC) chip. This area is divided between area used for elements actually acquiring the image and elements controlling the functionality of the image sensing element.

Typically, a light sensing element, such as a photodiode, takes up an area on a surface of the IC chip housing the imaging device. The area of the diode on the surface of the IC chip generates a signal indicative of the light striking the area.

However, the total pixel structure requires control circuitry for controlling the actions of the overall photodetector and the transmission of the signal from the photo-sensing element to the remainder of the imaging device. These control functions include select circuitry, amplifier circuitry, and reset circuitry. This control circuitry is typically made up of transistors and metal interconnect lines that take up space on the surface of the IC chip.

Thus, the total area for a single image detector cannot be used for light detection. The ratio of the light sensing surface to the total area required for the light detector structure including the detection circuitry and the control circuitry is known as the fill factor. Conventional imaging sensors generally have a low fill factor ratio. For a typical conventional sensor, the fill factor may range from 20% or so to 40% in higher end sensors.

With lower fill factors, the number of pixels per imaging device is lower. As such, fewer sensors may be placed in a given area, and the density of the light sensors on the IC chip is decreased.

With higher densities of imaging sensors on an IC chip, the total size of an imaging device may be reduced with the same number of pixels. Or, higher granularity or sensitivity may be obtained by putting more imaging sensors in a constant area.

Additionally, greater color clarity and color discrimination may be achieved with higher pixel or imaging sensor density. In some conventional color imaging devices, a coating may be used on an individual imaging element to selectively activate that imaging element for a particular wavelength of light.

In a red-green-blue (RGB) color scheme, for example, a single pixel or light sensor may be manufactured to be responsive to blue light. Other adjoining or nearby pixels or light sensors are manufactured to be responsive to red and green light, respectively. As for the pixel that is activated solely by blue light, the red and green components for the blue pixel may be estimated by using values of nearby pixels activated by red and green light, respectively.

Thus, for example, assume a fill factor of 25% for an older imaging sensor. If the fill factor can be improved to one of 75%, an imaging sensor could directly measure the red, green, and blue components of a target image in the area of an older single pixel, which also needs estimations from other adjoining pixels for missing color components. Thus, the color clarity of a target image may be improved with denser image sensors without sacrificing granularity. Correspondingly, an image of a finer granularity can be derived from a higher fill factor.

Thus, when the fill factor can be raised, more efficient imaging devices may be constructed. A higher fill factor means that the pixel structures or the individual imaging sensors may be placed closer together. Thus, a higher fill factor leads to having higher density of imaging devices per wafer. This leads to sharper images due to more imaging sensors, or to smaller IC chips for the same sensitivity of imager.

Many other problems and disadvantages of the prior art will become apparent when schooled in the art after comparing such prior art with the present invention described herein.

SUMMARY OF THE INVENTION

Various aspects of the invention may be found in a light imager. The light imager is contained on an integrated circuit (IC) chip or die. The light imager has one or more light sensors. Each of the light sensors has a light sensing element and control circuitry.

In the individual light sensors, the control circuitry is communicatively coupled to the light sensing element and controls the functions of the light sensing element. The control circuitry is substantially disposed within the IC chip, freeing the additional top area of the die for the light sensing elements.

In an alternative embodiment, the light imager has a processing circuitry. The processing circuitry is communicatively coupled to the one or more light sensors. The processing circuitry may also have an application program executing on it.

The placement of the control circuitry within the IC chip allows for a higher fill factor associated with each light sensor. As such, the fill factors of the light sensors can be greater than 50%.

The control circuitry of the invention may be such things as a reset transistor or an amplifier transistor. These components may be manufactured within the IC chip.

In another embodiment of the invention, a light imager is contained on an integrated circuit die. The light imager has one or more light sensors, the light sensors having a fill factor, or a ratio of the area used for collection of light to the total area of the light sensor.

The light sensors have a light sensing element and a control circuitry. The control circuitry is communicatively coupled to the light sensing element, and controls the operation of the light sensing element. Additionally, at least some of the control circuitry is disposed within the integrated circuit die.

In another exemplary embodiment of the invention, the light imager is contained on an integrated circuit chip. The light imager has one or more light sensors. The light sensors have control circuitry coupled to the light sensing elements.

Each of the light sensors is disposed on a corresponding sensor area on the integrated chip. The sensor area has a light sensing area, where the light is collected by a light sensing element. The light sensing area makes up at least 50% of the sensor area.

The light sensor may also have a processing circuitry communicatively coupled to the one or more light sensors.

Additionally, the light sensor may also have an application program executing on the processing circuitry.

Aspects of the invention may also be found in a light sensor. The light sensor is disposed on and within an integrated circuit chip. The light sensor has a fill factor, meaning the ration of the area used for light collection to the total area of the sensor. The light sensor has a light sensing element and control circuitry. The control circuitry is communicatively coupled to the light sensing element and controls the output of the light sensing element. The control circuitry is disposed substantially within the integrated circuit chip. As such, the fill factor of the light sensor is at least 50%. Portions of the control circuitry that may be disposed within the IC chip are a reset transistor and an amplifier transistor, among others.

DETAILED DESCRIPTION OF THE INVENTION

Figure 1:
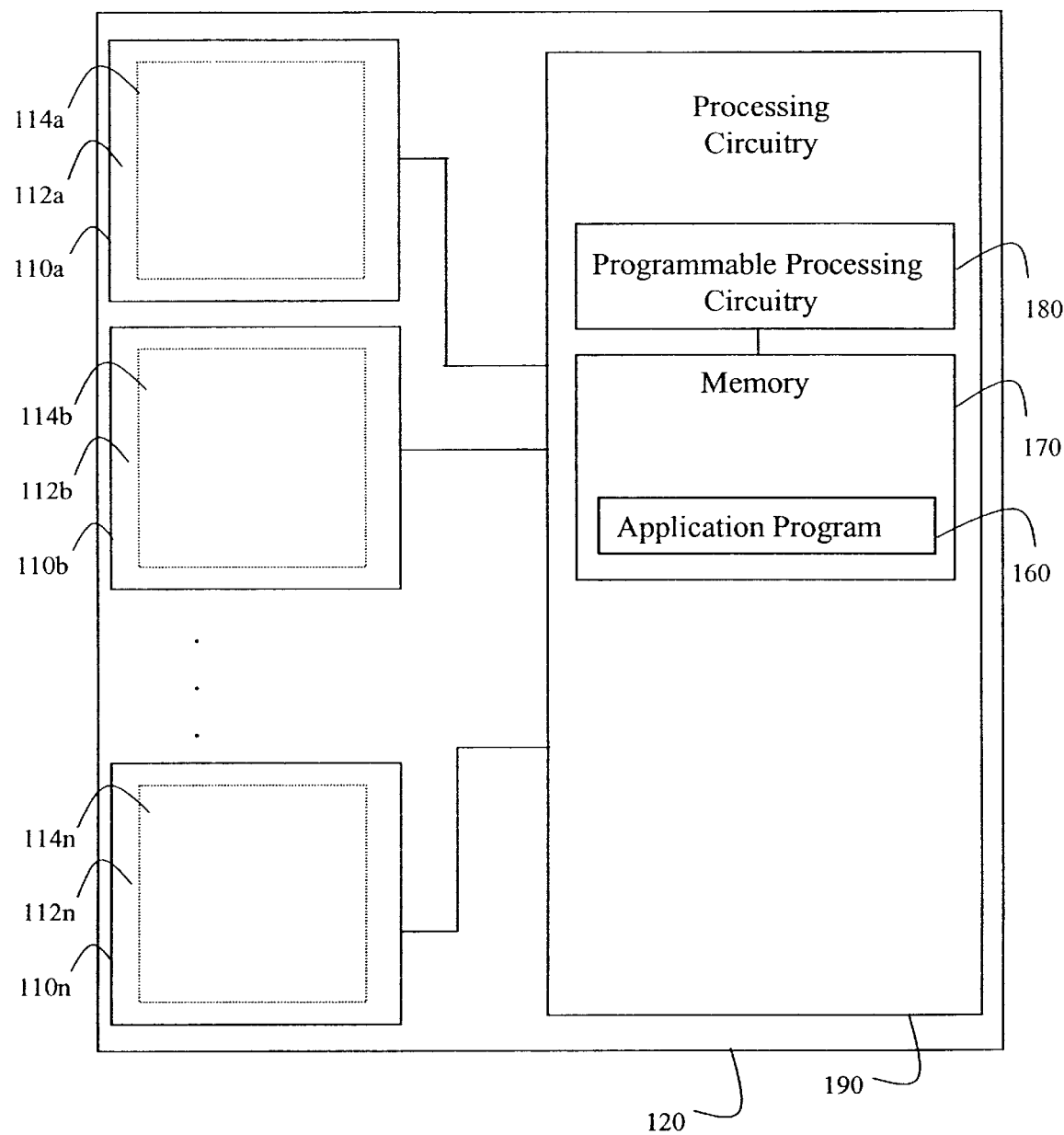
FIG. 1 is a block diagram of an imaging device according to the invention comprising a plurality of vertically oriented light sensor elements disposed about the imaging device.

FIG. 1 is a block diagram of an imaging device according to the invention comprising a plurality of vertically oriented light sensor elements disposed about the imaging device. A light imaging device 100 is disposed on an integrated circuit (IC) chip or die 120. The light imaging device is made up of one or more light sensors 110a–n coupled to a processing circuitry 190. The light sensors 110a–n are coupled to the processing circuitry 190 via signal lines, not labeled on the drawing.

The light sensors 110a–n are responsive to light striking them. The light sensors 110a–n generate a signal indicative of the light that strikes them. The signals are communicated to the processing circuitry 190, which then creates an electronic record of the image striking the light sensors 110a–n. The processing circuitry 190 may store the signals from the light sensors 110a–n, and may also perform further manipulation on them.

The processing circuitry 190 may contain a programmable processing circuitry 180 or a memory 170. The programmable processing circuitry may be operated through the use of an application program 160 contained in the memory 170. Thus, the processing circuitry may adaptively process the signals from the light sensors 110a–n.

The processing circuitry may be wholly or partially contained on the IC chip 120. Or, the processing circuitry 110 may be separate from the IC chip 120.

Each of the light sensors 110a–n are contained in an area of the die 120. The area utilized by each of the light sensors 110a–n can be broken into two different components. The light sensing areas 112a–n act to capture the light striking those areas and produce a signal indicative of that light. Typically, the light sensing area 112a–n each are occupied by a light sensing element, such as a photodiode. The remainder of the area occupied by the light sensors 110a–n, noted as the areas 114a–n, typically contain circuitry controlling the actions and responses of the light sensing elements.

In a conventional light sensor, the fill factor, or the ratio of the light sensing area to the total area occupied by a single light sensor can be as low as 15%. Other light sensors approach a fill factor of 40%.

In the present invention, the ratio of the light sensing area to the total area occupied by a single light sensor is 50% or above, due to the removal of much of the control circuitry away from the surface of the IC chip. The majority of the elements that do not collect the light are moved interior to the die 120. As such, most of the area on the surface of the die 120 in which the imaging sensor is placed can be used by the actual light sensor.

Thus, when portions of the control circuitry are removed to the interior of the die 120, the light sensors 110a–n may be placed on the die in a higher density. This allows for either a smaller die for the same efficiency, or for a more granulated image for IC chips with the same amount of area.

Figure 2:
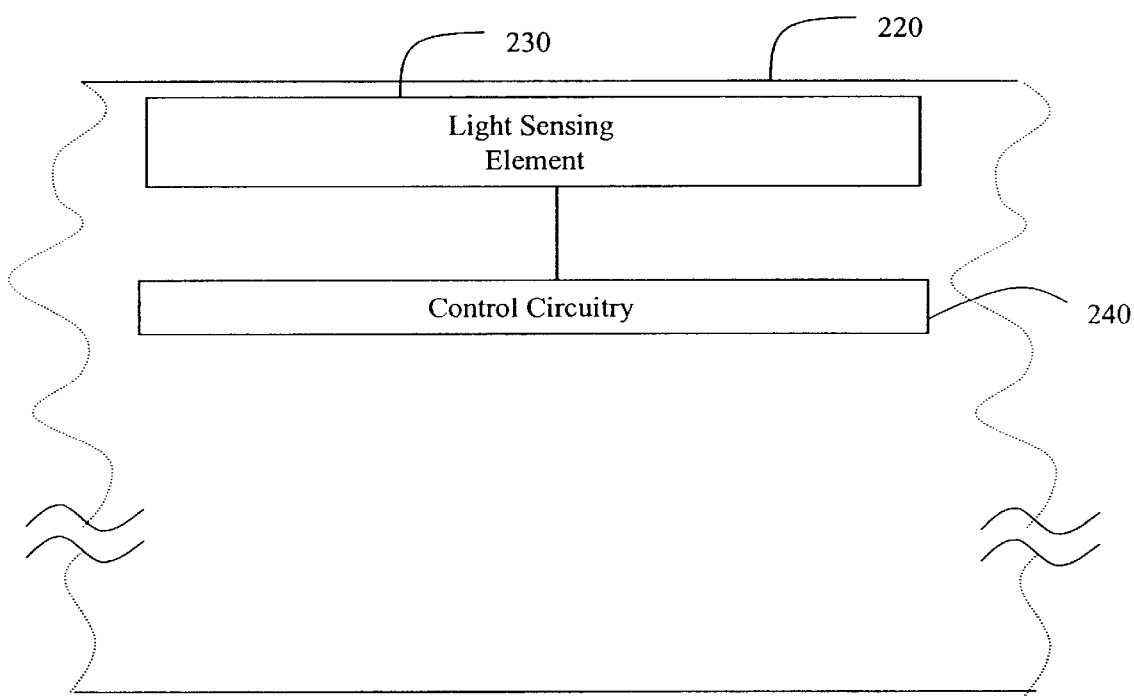
FIG. 2 is a cutaway vertical schematic view of an exemplary light sensor of FIG. 1 detailing the minimization of usage of surface area on the die occupied by the control circuitry.

FIG. 2 is a cutaway vertical schematic view of an exemplary light sensor of FIG. 1 detailing the minimization of usage of surface area on the die occupied by the control circuitry. A light sensor 210 is contained on and within an IC chip 220. The light sensor 210 comprises a light sensing element 230 coupled to a control circuitry 240.

The light sensing element 230 is a device that responds to light striking it. In response to the light striking the light sensing element 230, it generates a signal indicative of the intensity of that light striking. The control circuitry 240 controls the transfer of the signals generated by the light sensing element 230 to the processing circuitry, not shown in this figure.

The control circuitry 240 may control several aspects of the functionality of the light sensing elements 230. For example, control circuitry 240 may contain circuitry for enabling or gating the passage of the signal generated by the light sensing element 230 to the processing circuitry. Or, the control circuitry 240 may amplify the signal generated by the light sensing element 230 as light is striking it. Or, the control circuitry 240 can reset the amplifier mentioned above.

The control circuitry 240 is formed beneath the surface of the integrated circuit chip 210, as,indicated in FIG. 2. Placing the control circuitry 240 within the integrated circuit chip 210 rather than on the surface of the integrated circuit chip enhances the functionality of the image device. More surface area is available for light acquisition, rather than sacrificing precious surface for control functionality. As such, the densities of imaging sensors can be greatly increased, leading to the benefits of greater granularity and/or greater color discrimination in the imaging device, or smaller chip sizes.

Figure 3A:
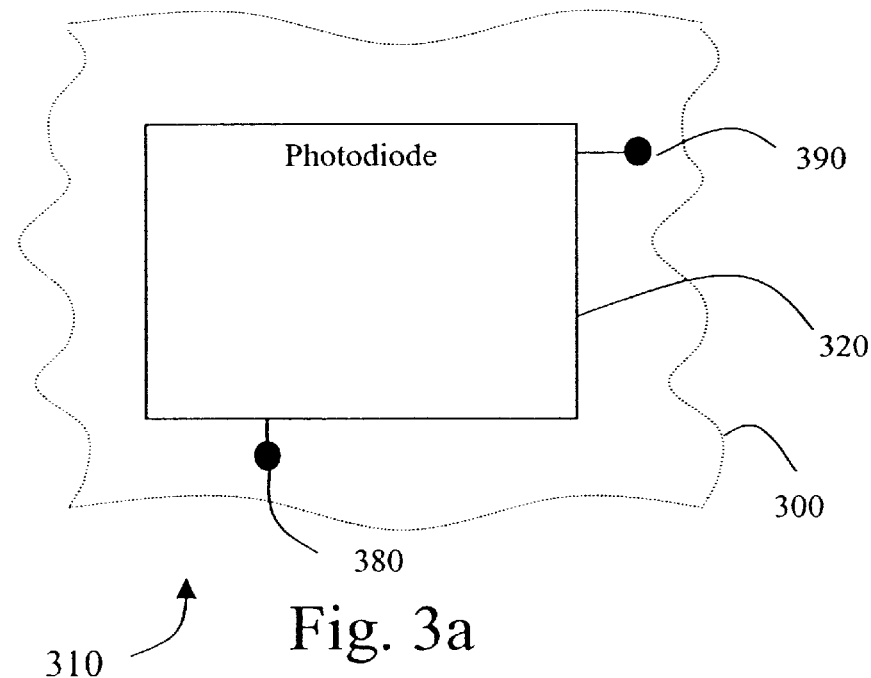
FIGS. 3a and 3b are schematic diagrams illustrating a particular embodiment of the light sensor of FIG. 2.
Figure 3B:
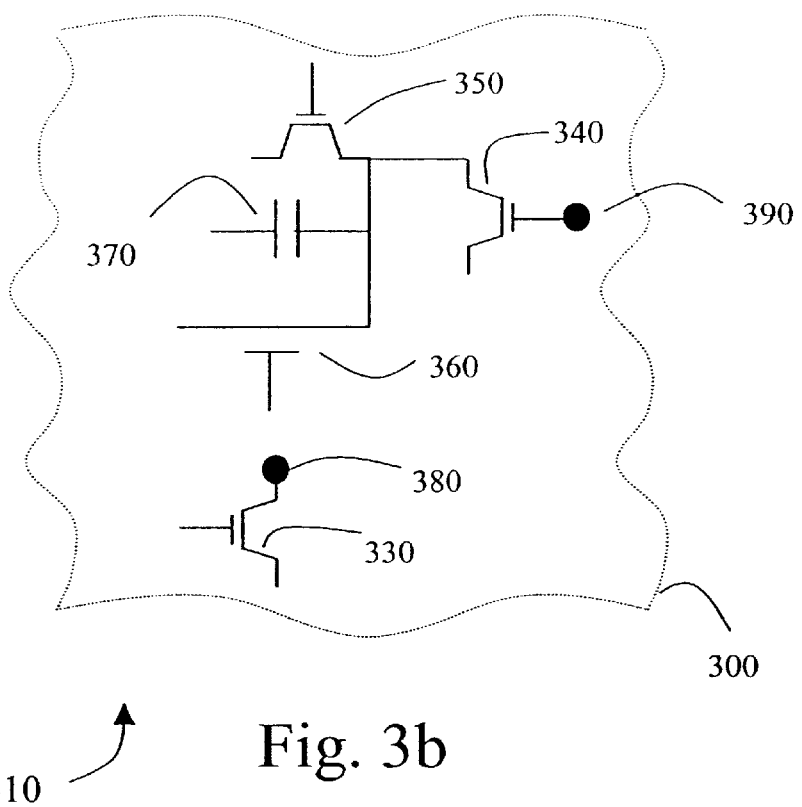

FIGS. 3a and 3b are schematic diagrams illustrating a particular embodiment of the light sensor of FIG. 2. FIG. 3a is a top plan view of a layer of an IC chip 300 containing a light sensor 310. The light sensor 310 is disposed on multiple layers in the substrate of the IC chip 300. The topmost layer of the light sensor 310 is a light sensing element, in this case a photodiode 320.

FIG. 3b is a planar view of an interior layer of the IC chip of FIG. 3a, showing the control circuitry of the light sensor 310 disposed within the IC chip 300. The control circuitry of the light sensor 310 can be such elements as a reset transistor 330, an amplification transistor 340, a memory select transistor 350, a selection transistor 360, and a storage element 370.

The photodiode 320 is connected to the reset transistor 330 through an interconnect 380. The reset transistor 330 allows a processing circuitry (not shown) to clear the photodiode 310 after the signal indicative of the light striking the photodiode 320 has been read and/or transferred.

The photodiode 320 is also connected to an amplification transistor 340, also through an interconnect 390. Additional control components for the light sensor 310 comprise a memory select transistor 250, a selection transistor 360, and a storage element 370.

The control circuitry of the light sensor 310, in this case the reset transistor 330, the amplification transistor 340, the select transistor 350, the storage element 370, and/or the memory select transistor 360 are contained within the substrate of the IC chip 300. As such, the control circuitry for the light sensor 310 resides within the die 300, and is disposed below the light sensing element 320, or offset from it and interior to the chip 300.

Thus, a light sensor with a high fill factor is through placing the control components of the light sensor away from the light detecting surface is shown.

However, the entirety of the control circuitry for a light sensor need not exist solely beneath the surface of the die to gain the added benefits of the invention. Small proportions of the control circuitries for a light sensor may co-exist on the surface of the die with the light sensing elements.

Figure 4:
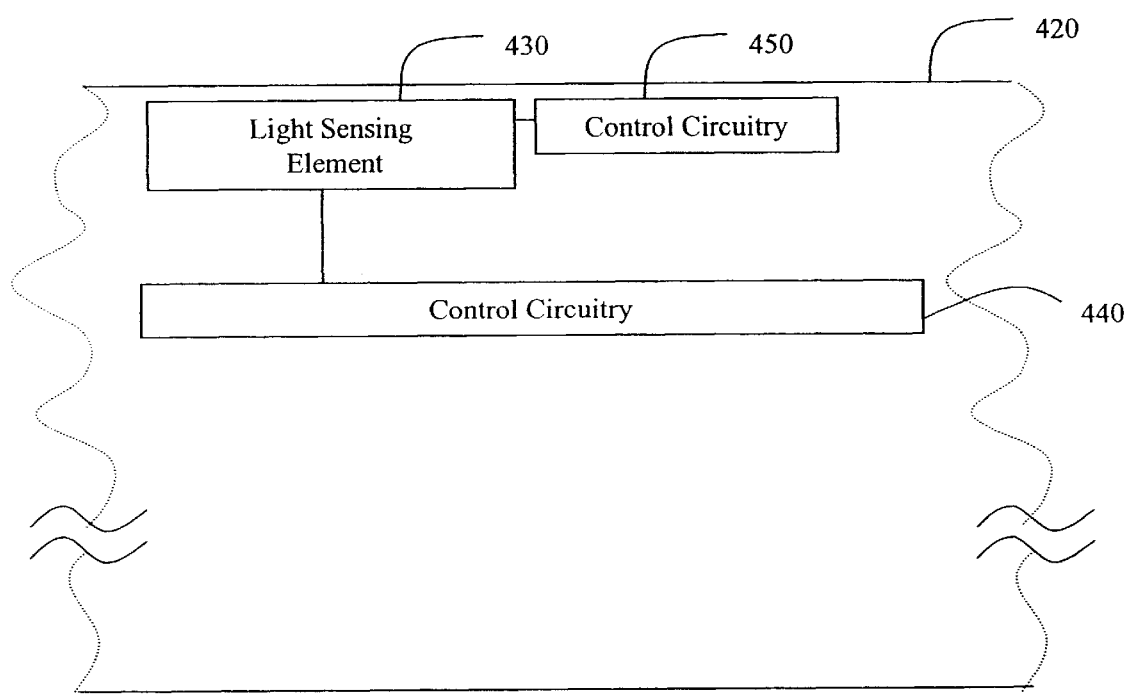
FIG. 4 is a cutaway vertical schematic diagram of an alternative imaging sensor of FIG. 1.

FIG. 4 is a cutaway vertical schematic diagram of an alternative imaging sensor of FIG. 1. A light sensor 410 is contained on and within an IC chip 420. The light sensor 410 comprises a light sensing element 430 coupled to a control circuitry 440 and a control circuitry 450.

The light sensing element 430 is a device that responds to light striking it. In response to the light striking the light sensing element 430, it generates a signal indicative of the intensity of that light striking. The control circuitries 440 and 450 control the transfer of the signals generated by the light sensing element 430 to the processing circuitry, not shown in this figure.

The control circuitries 440 and 450 control several aspects of the functionality of the light sensing elements 430. For example, the control circuitries 440 and 450 may contain circuitry for enabling or gating the passage of the signal generated by the light sensing element 430 to the processing circuitry. Or, the control circuitries 440 and 450 may amplify the signal generated by the light sensing element 430 as light is striking it. Or, the control circuitries 440 and 450 can reset the amplifier mentioned above.

The control circuitry 440 is formed beneath the surface of the integrated circuit chip 410, as indicated in FIG. 4. Placing the control circuitry 440 within the integrated circuit chip 410 rather than on the surface of the integrated circuit chip enhances the functionality of the image device. More surface area is available for light acquisition, rather than sacrificing precious surface for control functionality. As such, the densities of imaging sensors can be greatly increased, leading to the benefits of greater granularity and/or greater color discrimination in the imaging device.

The additional control circuitry 450 is placed on the surface or topmost layer of the IC chip 410 in conjunction with the light sensing element 430. The additional control circuitry 450 placed on the level of the light sensing element should be minimal, allowing for as high a fill factor as possible. In order to fully take advantage of the present invention, a good proportion of the control circuitry should be placed within the IC chip, preferably allowing a fill factor of 50% or greater.

Figure 5A:
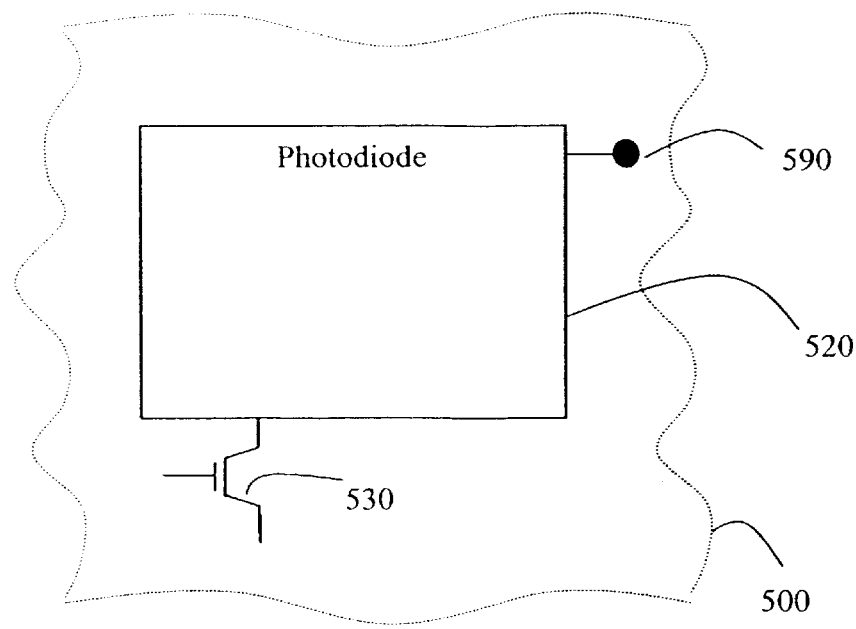
FIGS. 5a and 5b are schematic diagrams illustrating an exemplary embodiment of the light sensor of FIG. 4.
Figure 5B:
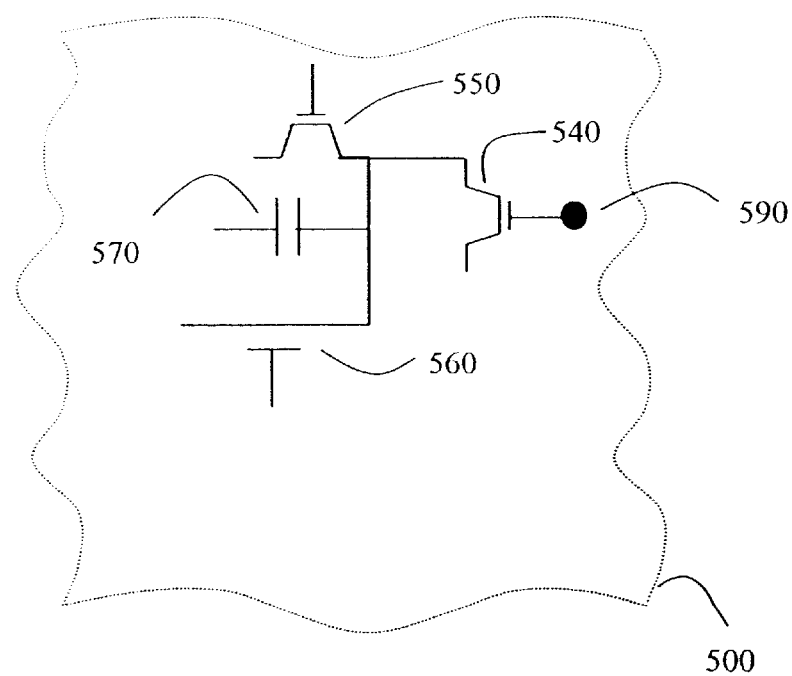

FIGS. 5a and 5b are schematic diagrams illustrating an exemplary embodiment of the light sensor of FIG. 4. FIG. 5a is a top plan view of a layer of an IC chip 500 containing a light sensor 510. The light sensor 510 is disposed on multiple layers in the IC chip substrate 510. The topmost layer of the light sensor 510 is a light sensing element, in this case a photodiode 520. Also present is a reset transistor 530, coupled to the light sensing element FIG. 5b is a planar view of an interior layer of the IC chip of FIG. 5a, showing a control circuitry of the light sensor 510 disposed within the IC chip 500. The control circuitry of the light sensor 510 can be such elements as an amplification transistor 540, a memory select transistor 550, a selection transistor 560, and a storage element 570.

The photodiode 520 is connected to the reset transistor 530 on the surface of the IC chip 500. The reset transistor 530 allows a processing circuitry (not shown) to clear the photodiode 520 after the signal indicative of the light striking the photodiode 520 has been read and/or transferred.

The photodiode 520 is also connected to an amplification transistor 540, interior to the IC chip 500. The photodiode 520 is connected to the amplification transistor 540 through an interconnect 580. Additional control components for the light sensor 510 comprise a memory select transistor 550, a selection transistor 560, and a storage element 570.

Most of the control circuitry of the light sensor 510, in this case, the amplification transistor 540, the select transistor 550, the storage element 570, and/or the memory select transistor 560 are contained within the IC chip 500. As such, the control circuitry for the light sensor 510 resides within the die 500, and is disposed below the light sensing element 520. However, the control circuitry may also be disposed in the die 500 offset from the light sensing element 520. Thus, a light sensor with a high fill factor is through placing most of the control components of the light sensor away from the light detecting surface is shown.

In another exemplary embodiment of the invention, the amplification transistor 540 could be placed on the surface of the IC chip 500 and connected to the remainder of the control circuitry through an interconnect. However, this arrangement would result in one more interconnect for the light sensor 510.

Figure 6A:
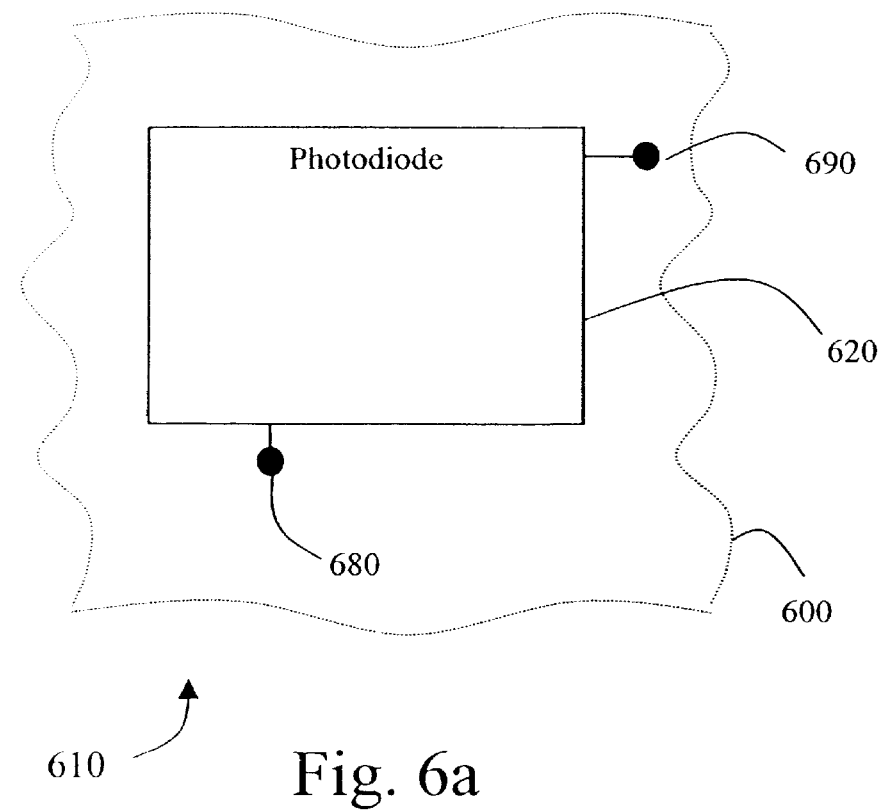
FIGS. 6a and 6b are schematic diagrams illustrating another exemplary embodiment of the light sensor of FIG. 4.
Figure 6B:
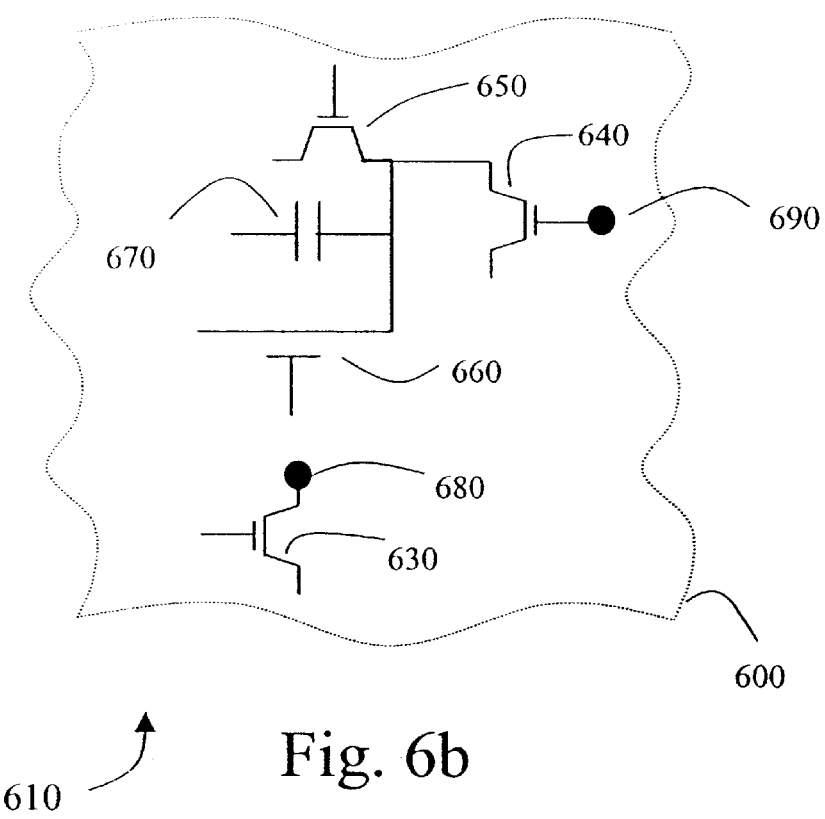

FIGS. 6a and 6b are schematic diagrams illustrating another exemplary embodiment of the light sensor of FIG. 4. FIG. 6a is a top plan view of a layer of an IC chip 600 having a substrate 610 and containing a light sensor 610. The light sensor 610 is disposed on multiple layers in the IC chip substrate 610. The topmost layer of the light sensor 610 is a light sensing element, in this case a photodiode 620. Also present is a reset transistor 630 and an amplification transistor 640, each coupled to the light sensing element 620.

FIG. 6b is a planar view of an interior layer of the IC chip of FIG. 6a, showing a control circuitry of the light sensor disposed within the IC chip 600. The control circuitry of the light sensor 610 can be such elements as a memory select transistor 650, a selection transistor 660, and a storage element 670.

The photodiode 620 is connected to the reset transistor 630 within the IC chip 600. The reset transistor is coupled to the photodiode 620 through an interconnect 580. The reset transistor 630 allows a processing circuitry (not shown) to clear the photodiode 620 after the signal indicative of the light striking the photodiode 620 has been read and/or transferred.

The photodiode 620 is also connected to an amplification transistor 640 present on the same level of the IC chip 600 as the photodiode 620. Additional control components are coupled in turn to the amplification transistor 640. These additional control components can comprise a memory select transistor 650, a selection transistor 660, and a storage element 670.

However, the additional control components, namely the memory select transistor 650, the selection transistor 660, and the storage element 670 are present on a different level apart from the amplification transistor 640 and the photodiode 620. These components are manufactured within the IC chip 600. These other control components are coupled to the amplification transistor 640 through an interconnect 690.

Most of the control circuitry of the light sensor 610, in this case, the select transistor 650, the storage element 670, and/or the memory select transistor 660 are contained within the IC chip 600. As such, the control circuitry for the light sensor resides within the die 600, and is disposed below the light sensing element 620.

We claim:

1. A light imager contained on an integrated circuit die, the light imager comprising:
   one or more light sensors, the one or more light sensors comprising:
      a light sensing element;
      control circuitry, having a plurality of transistors, communicatively coupled to the light sensing element, controlling the functions of the light sensing element; and
      the control circuitry substantially disposed within the integrated circuit die such that a vertical stack is formed with the one or more light sensors.

2. The light imager of claim 1 further comprising a processing circuitry communicatively coupled to the one or more light sensors.

3. The light imager of claim 2 further comprising an application program executing on the processing circuitry.

4. The light imager of claim 1, wherein a fill factor associated with each of the one or more light sensors is greater than 50%.

5. The light imager of claim 1, the control circuitry comprising:
   a reset transistor, communicatively coupled to the light sensing element, disposed within the integrated circuit die.

6. A light imager contained on an integrated circuit chip, the light imager comprising:
   one or more light sensors, each of the one or more light sensors disposed on a corresponding sensor area on the integrated chip, the each of the corresponding sensor areas comprising a light sensing area, the one or more light sensors comprising:
      a light sensing element;
      a control circuitry, having a plurality of transistors, coupled to the light sensing element such that a vertical stack is formed with the one or more light sensors; and
      the light sensing area making up at least 50% of the sensor area.

7. The light imager of claim 6 further comprising a processing circuitry communicatively coupled to the one or more light sensors.

8. The light imager of claim 7 further comprising application program executing on the processing circuitry.

9. A light sensor disposed on and within an integrated circuit chip, the light sensor having a fill factor, the light sensor comprising:
   a light sensing element;
   a control circuitry, having a plurality of transistors, communicatively coupled to the light sensing element, controlling the operation of the light sensing element; and
   the control circuitry disposed substantially within the integrated circuit chip to form a vertical stack with the light sensing element.

10. The light sensor of claim 9 wherein the fill factor is at least 50%.

11. The light sensor of claim 9, the control circuitry further comprising a reset transistor, the reset transistor disposed within the integrated chip.

12. The light sensor of claim 9, the control circuitry further comprising an amplifier transistor, the amplifier transistor disposed within the integrated chip.

13. A light sensor contained in and on an integrated circuit chip, the light sensor contained in a sensor area on a surface of the integrated circuit chip, the sensor area comprising a light sensing area, the light sensor comprising:
   a light sensing element;
   control circuitry, having a plurality of transistors, communicatively coupled to the light sensing element, controlling the operation of the light sensing element;
   the control circuitry disposed, at least in part, within the integrated circuit chip to form a vertical stack with the light sensing element; and
   the light sensing area is 50% or more of the sensor area.

14. The light sensor of claim 13, the control circuitry further comprising a reset transistor, the reset transistor disposed within the integrated chip.

15. The light sensor of claim 13, the control circuitry further comprising an amplifier transistor, the amplifier transistor disposed within the integrated chip.

16. A light imager contained on an integrated circuit die, the light imager comprising:
   one or more light sensors, each of the one or more light sensors having a fill factor, the one or more light sensors comprising:
      a light sensing element;
      a control circuitry, having a plurality of transistors, communicatively coupled to the light sensing element, controlling the operation of the light sensing element; and
      at least some of the control circuitry disposed within the integrated circuit die to form a vertical stack with the light sensing element.

17. The light imager of claim 16 further comprising a processing circuitry communicatively coupled to the one or more light sensors.

18. The light imager of claim 17 further comprising application program executing on the processing circuitry.

19. The light imager of claim 6 wherein the fill factor of each of the one or more light sensors is at least 50%.

20. The light imager of claim 6, the control circuitry comprising:
   an amplification transistor disposed within the integrated circuit die.

21. The light imager of claim 6, the control circuitry comprising:
   a reset transistor disposed within the integrated circuit die.

* * * * *